United States Patent
Bandara et al.

(10) Patent No.: US 6,521,967 B1
(45) Date of Patent: Feb. 18, 2003

(54) THREE COLOR QUANTUM WELL INFRARED PHOTODETECTOR FOCAL PLANE ARRAY

(75) Inventors: Sumith V. Bandara, Valencia, CA (US); John K. Liu, Pasadena, CA (US); Daniel Wilson, Montrose, CA (US); Sarath D. Gunapala, Valencia, CA (US); William Parrish, Santa Barbara, CA (US)

(73) Assignee: California Institute of Technology, Pasadena, CA (US)

( * ) Notice: Subject to any disclaimer, the term of this patent is extended or adjusted under 35 U.S.C. 154(b) by 105 days.

(21) Appl. No.: 09/629,396

(22) Filed: Aug. 1, 2000

Related U.S. Application Data

(60) Provisional application No. 60/147,375, filed on Aug. 4, 1999, provisional application No. 60/147,513, filed on Aug. 5, 1999, and provisional application No. 60/147,514, filed on Aug. 5, 1999.

(51) Int. Cl.[7] ............ H01L 31/00; H01L 21/00
(52) U.S. Cl. ............ 257/440; 257/21; 257/443; 257/448; 438/74; 438/94; 250/339.02
(58) Field of Search ............ 257/21, 184, 189, 257/440, 443, 448, 459, 460, 466; 438/54, 57, 66, 67, 74, 94; 250/338.4, 339.02, 338.1, 338.2

(56) References Cited

U.S. PATENT DOCUMENTS

| | | | |
|---|---|---|---|
| 5,506,419 A | 4/1996 | Levine et al. | |
| 5,552,603 A | * 9/1996 | Stokes | 250/338.4 |
| 5,563,423 A | 10/1996 | Wu et al. | |
| 5,646,421 A | * 7/1997 | Liu | |
| 5,763,896 A | 6/1998 | Smith | |
| 5,844,253 A | 12/1998 | Kim et al. | |
| 5,978,399 A | 11/1999 | Doughty | |
| 6,184,538 B1 | * 2/2001 | Bandara et al. | 250/338.4 |

* cited by examiner

Primary Examiner—Steven Loke
Assistant Examiner—Donghee Kang
(74) Attorney, Agent, or Firm—Fish & Richardson P.C.

(57) ABSTRACT

A three-color QWIP focal plane array is based on a GaAs/AlGaAs material system. Three-color QWIPs enable target recognition and discriminating systems to precisely obtain the temperature of two objects in the presence of a third unknown parameter. The QWIPs are designed to reduce the normal reflection over a significant wavelength range. One aspect of the present invention involves two photon absorptions per transition in a double quantum well structure which is different from typical QWIP structures. This design is expected to significantly reduce the dark current as a result of higher thermionic barriers and therefore allow the devices to operate at elevated temperatures. The device is expected to be fabricate using a $GaAs/Al_xGa_{1-x}As$ material system on a semi-insulating GaAs substrate by Molecular Beam Epitacy (MBE).

7 Claims, 7 Drawing Sheets

THREE COLOR QUANTUM WELL INFRARED PHOTODETECTOR FOCAL PLANE ARRAY

CROSS-REFERENCE TO RELATED APPLICATIONS

This application claims benefit of U.S. Provisional Application Nos. 60/147,375, filed Aug. 4, 1999, No. 60/147,513, filed Aug. 5, 1999, and No. 60/147,514, filed Aug. 5, 1999.

ORIGIN OF INVENTION

The invention described herein was made in the performance of work under a NASA contract, and is subject to the provisions of Public Law 96-517 (35 U.S.C. §202) in which the Contractor has elected to retain title.

1. Technical Field

This invention relates to imaging systems, and more particularly to Quantum Well Infrared Photodetectors.

2. Background

Infrared imaging is widely used in a variety of applications including night vision, surveillance, search and rescue, remote sensing, and preventive maintenance, to name a few. Imaging devices to provide these applications are typically constructed of HgCdTe or InSb focal plane arrays. These focal plane arrays are known to be pixel mapped devices, where an array element is generally mapped to one or more circuit elements. However, such focal plane arrays are difficult to manufacture and expensive. Quantum Well Infrared Photodetectors (QWIPs) can detect mid and far infrared light, providing an output current as a result.

GaAs based Quantum Well Infrared Photodetectors are useful for several applications such as target recognition and discrimination which require mid-wavelength:long-wavelength, long-wavelength:long-wavelength, and long-wavelength:very-long wavelength large area, uniform, reproducible, low cost and stable multi-color infrared focal plane arrays (FPAs). For example, a two-color FPA camera would provide the absolute temperature of a target which is extremely important to the process of identifying temperature difference between targets, war heads and decoys. On the other-hand, two-color is not sufficient in identifying the absolute temperature of objects in the presence of a third variable such as the Earth's reflection in exo-atmospheric applications. Thus, three-color FPAs are more suitable for exo-atmospheric target recognition applications.

Random reflectors are potentially broadband optical coupling structures for QWIPs. When combined with a thinned QWIP substrate, the random surface can trap the optical field by reflecting the waves at different angles on each bounce. For efficient coupling to the absorbing QW layer, the surface should (1) diffract efficiently into high angles, and (2) have near-zero diffraction efficiency at low angles. Condition 1 can be produced by a surface that has significant depth variation on the scale of one wavelength. Condition 2 can be produced by a surface that produces destructive interference of all reflected waves in the direction normal to the surface. To produce a broadband optical coupling structure, both conditions need to be satisfied over a significant wavelength range. Zeroing the normal reflection, however, is the more important condition since any normally reflected light is lost without any absorption. The structures described here can produce a minimal normal reflection over a significant wavelength range. In all the simulations, scalar electromagnetic theory is used, and this is only an approximation when the wavelength is on the order of the feature size.

Imaging systems that operate in the very long wavelength infrared (VLWIR) region are required in a variety of NASA's earth science applications, such as geological and volconological studies, monitoring global atmospheric temperature profiles, cloud characteristics, and relative humidity profiles. This is mainly due to the fact that most absorption lines of atmospheric gas molecules such as ozone, water, carbon dioxide, carbon monoxide, sulfur dioxide, and nitrous oxide occur in the LWIR spectral range. In addition, 12–18 $\mu$m focal plane arrays (FPAs) would be very useful in detecting cold objects such as ballistic missiles in midcourse (when hot rocket engine is not burning most of the emission peaks are in the 8–15 $\mu$m IR region). Thus, it is desirable to develop highly sensitive, low power dissipation, large, VLWIR FPAs which can simplify the design and construction of infrared imaging systems.

Spectral response of conventional interband infrared (IR) detectors are completely determined by the bandgap because photoexcitation occurs across the band gap ($E_g$) from the valence to conduction band. Therefore, detection of very is long wavelength IR radiation requires small bandgap materials such as $Hg_{1-x}Cd_xTe$ and $Pb_{1-x}Sn_xTe$, in which the energy gap can be controlled by varying x. It is well known that these low band gap materials are more difficult to grow and process than large band gap semiconductors such as GaAs. Although, these detectors in single element format show high performances at higher operating temperatures, it is extremely difficult to produce them in large format uniform arrays.

Quantum Well Infrared Photodetectors avoid such difficulties because they are fabricated using high bandgap materials systems such as $GaAs/Al_xGa_{1-x}As$. The detection mechanism of QWIP involves photoexcitation of electrons between ground and first excited states (subbands) of the quantum well which is created in the conduction band due to bandgap difference in the material system. Quantum well parameters for $GaAs/Al_xGa_{1-x}As$ material systems can be designed to detect light at any wavelength from 6 to 25 $\mu$m range. The advantages of QWIPs compared with HgCdTe detectors include high uniformity, excellent reproducibility, low 1/f noise and low-cost large-area staring arrays. However, it is difficult to obtain this signal to noise ratio for VLWIR QWIPs at high operating temperatures. This is due to high dark current which is dominated by classical thermionic emission at such operating temperatures.

SUMMARY

The present invention includes a three-color QWIP focal plane array. The three-color QWIP focal plane array is based on a GaAs/AlGaAs material system. Three-color QWIPs enable target recognition and discriminating systems to precisely obtain the temperature of two objects in the presence of a third unknown parameter. The QWIPs are designed to reduce the normal reflection over a significant wavelength range.

One aspect of the present invention involves two photon absorptions per transition in a double quantum well structure which is different from typical QWIP structures. This design is expected to significantly reduce the dark current as a result of higher thermionic barriers and therefore allow the devices to operate at elevated temperatures. The device is expected to be fabricated using a $GaAs/Al_xGa_{1-x}As$ material system on a semi-insulating GaAs substrate by Molecular Beam Epitacy (MBE).

DESCRIPTION OF DRAWINGS

These and other features and advantages of the invention will become more apparent upon reading the following detailed description and upon reference to the accompanying drawings.

DETAILED DESCRIPTION

Figure 1:
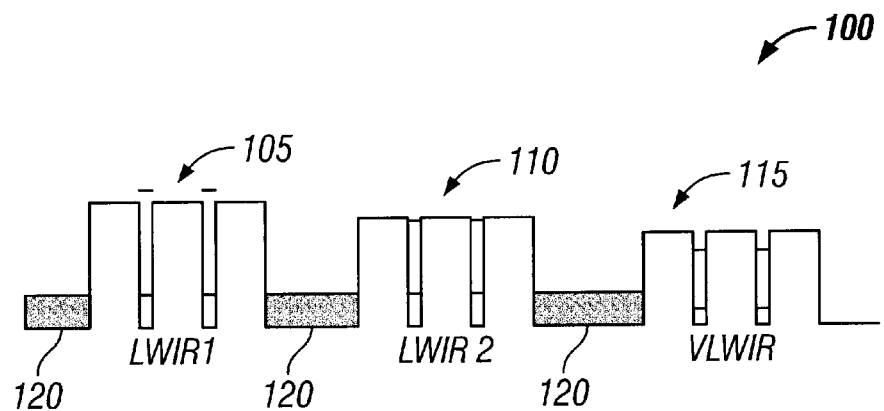
FIG. 1 shows a schematic conduction band diagram of the bound-to-continuum, bound-to-quasibound, and bound-to-bound three color QWIP according to one embodiment of the present invention.

FIG. 1 shows the schematic conduction band diagram of the proposed three-color QWIP device which utilizes bound-to-continuum (B-C) 105, bound-to-quasibound (B-QB) 110, and bound-to-bound (B-B) 115 intersubband absorption. The device structure consists of a stack of 30 periods of a 7–8 micron bound-to-continuum photosensitive multiquantum well (MQW) structure, a stack of 30 periods of a 10.5–11.5 micron bound-to-quasibound photosensitive MQW structure, and another stack of 30 periods of a 14–15 micron bound-to-bound photosensitive MQW structure. All three photosensitive MQW stacks will consist of 30 periods of 500 Å $Al_xGa_{1-x}As$ barrier and a GaAs well. These three stacks are separated by two 0.5 micron thick doped GaAs contact layers 120.

The Al mole fraction x and GaAs quantum well width of each MQW stack are tuned independently to obtained the desired infrared detection wavelength and the most suitable device structure. (i.e., B-C, B-B, or B-QB). This entire three-color QWIP structure is then sandwiched between 0.5 micron GaAs, top and bottom contact layers doped n=5× $10^{17}$ $cm^{-3}$, and will be grown on a semi-insulating GaAs substrate by molecular beam epitaxy (MBE). Then a 1.3 micron thick GaAs cap layer on top of a 300 Å $Al_{0.3}Ga_{0.7}A$ stop-etch layer will be grown in situ on top of the device structure to fabricate the light coupling optical cavity.

Figure 2:
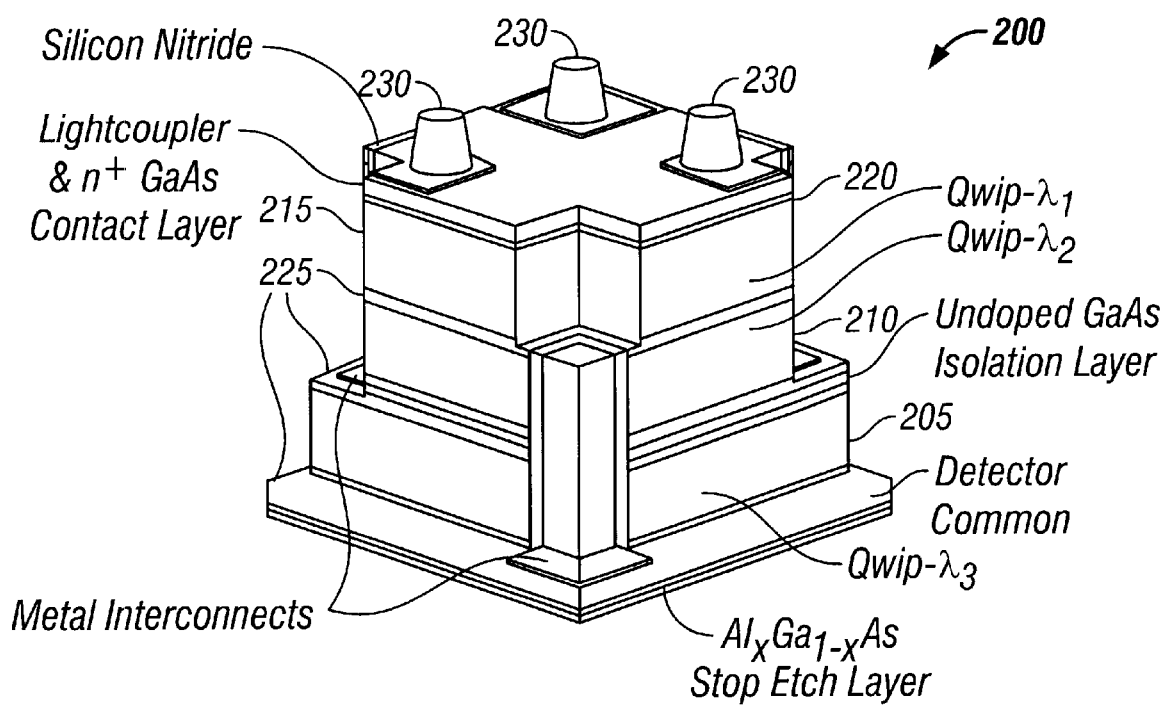
FIG. 2 is a three dimensional view of the three color QWIP device according to an embodiment of the present invention.

FIG. 2 shows a schematic diagram of a three-color QWIP pixel 200. The present invention allows independent access to all three vertically integrated QWIPs 205, 210, and 215. QWIPs 205, 210, and 215 do not absorb radiation incident normal to the surface since the light polarization must have an electric field component normal to the layers of superlattice (growth direction) to be absorbed by the confined carriers. As a consequence, for imaging, it is necessary to be able to couple light uniformly to two dimensional arrays of these detectors. The infrared radiation can be coupled to the detectors in the FPA by fabricating randomly roughened reflecting surfaces or two dimensional cross gratings. The photoexcitation of the confined carriers in the MQW region occurs due to non zero polarization components of the reflected light along the growth direction.

After the achromatic random reflector is defined by the lithography and dry etching, the photoconductive 7–8 micron QWIPs are fabricated by dry etching through the first stack of photosensitive $GaAs/Al_xGa_{1-x}As$ MQW layers 220 into the 0.5 μm thick first heavily doped GaAs intermediate contact layer 225. Then the photoconductive 10.5–11.5 micron QWIPs will be fabricated by dry etching through the second stack of photosensitive $GaAs/Al_xGa_{1-x}As$ MQW layers into the second heavily doped GaAs intermediate contact layer 225. Then the photoconductive QWIPs of the 14–15 micron QWIPs will be fabricated by dry etching through the third stack of photosensitive $GaAs/Al_xGa_{1-x}As$ MQW layers into the 1.0 μm thick heavily doped GaAs bottom contact layer. The achromatic random reflectors on top of the detectors will then be covered with Au/Ge and Au for Ohmic contact and reflection.

Figure 3:
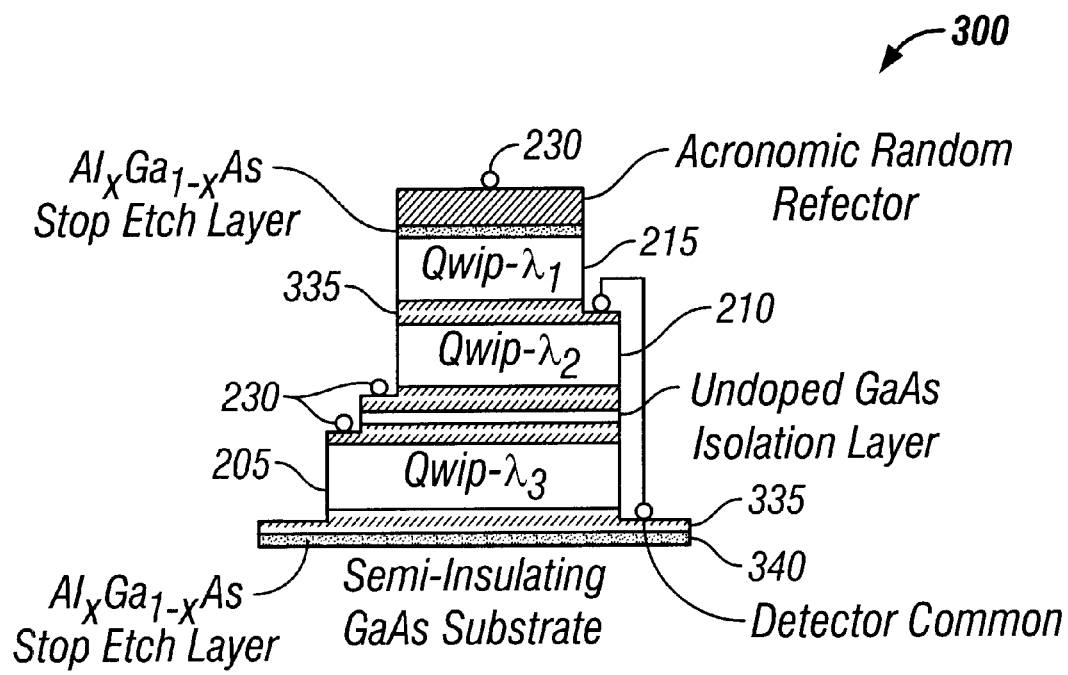
FIG. 3 is a side view of the three color QWIP device of FIG. 2 according to an embodiment of the present invention.
Figure 4:
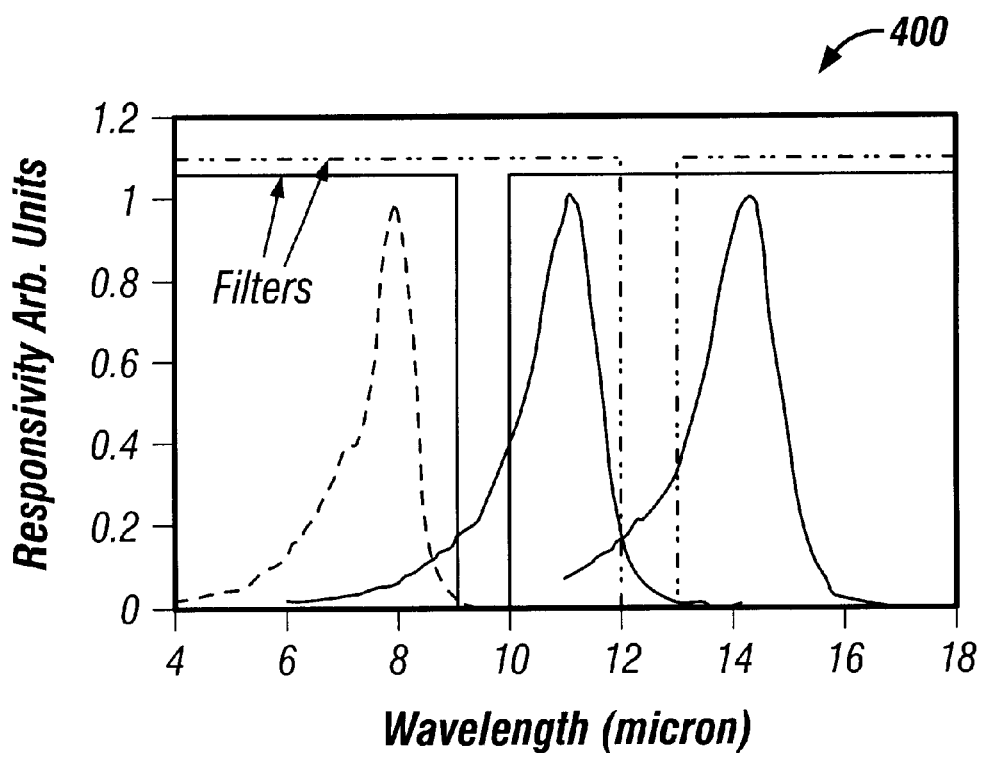
FIG. 4 illustrates the responsivity spectrums of the three color QWIP device according to an embodiment of the present invention.

FIG. 3 shows a side view 300 of the QWIP device. Separate metal contact layers 335 are fabricated on 8–9, 10.5–11.5 and 14–15 micron QWIPs during the metalization process. Therefore, the fill factor of the top 14–15, middle 10.5–11.5, and bottom 8–9 micron detectors will be about 80%, 85%, and 90% respectively. Then indium bumps 230 can be evaporated onto all four metal pads of each QWIP pixel to achieve independent access to all three vertically integrated three-color QWIPs. The advantages of this approach include simultaneous readout and full spatial resolution for all three wavelength bands. FIG. 4 shows the responsivity spectrums 400 of all three wavelength bands of the proposed three-color QWIP.

Proposed three-color QWIP device structures may be grown on three-inch semi-insulating GaAs substrates 340 by using MBE. During the materials growth process the materials quality will be optimized against many growth parameters such as substrate temperature and growth rate. These materials are tested prior to test device fabrication using Hall measurements, photoluminescence, and X-ray diffraction.

For ease of lithographic fabrication, the surface will be composed of square pixels having variable depth. Assuming normal incidence and equal reflectivity of all pixels, the condition for null reflection at zero angle is $$\sum_p \exp[i\phi_p(\lambda)] = 0 \tag{1}$$

where p is the pixel index, $\phi_p=4\pi d_p/\lambda$ is the phase delay of pixel p, $d_p$ is the depth of pixel p, and λ is the wavelength inside the material. If the random surface is made up cells having 2×2 pixels, there are a variety of ways one can choose the pixel depths for minimum reflection. In all the designs, the goal is to design around a free space wavelength of 15 μm, the refractive index is 3.1, and the pixel size is 2.5 μm.

Equation (1) can be satisfied at two wavelengths if the depths are chosen as:

$d_1 = rand(0 \ldots \lambda_1/4),$ $d_2 = d_1 + \lambda_1/4,$ $d_3 = d_1 + \lambda_2/4,$ $d_4 = d_1 + \lambda_1/4 + \lambda_2/4$ Pixel 1 is given a random depth and the locations of $d_1 \ldots d_4$ within the cell are selected at random to make the overall surface highly random. When the pixels have these depths, they produce destructive interference in pairs. At $\lambda_1$, destructive interference occurs between pixels 1 and 2, and between pixels 3 and 4. At $\lambda_2$, destructive interference occurs between pixels 1 and 3, and between pixels 2 and 4.

Figure 5:
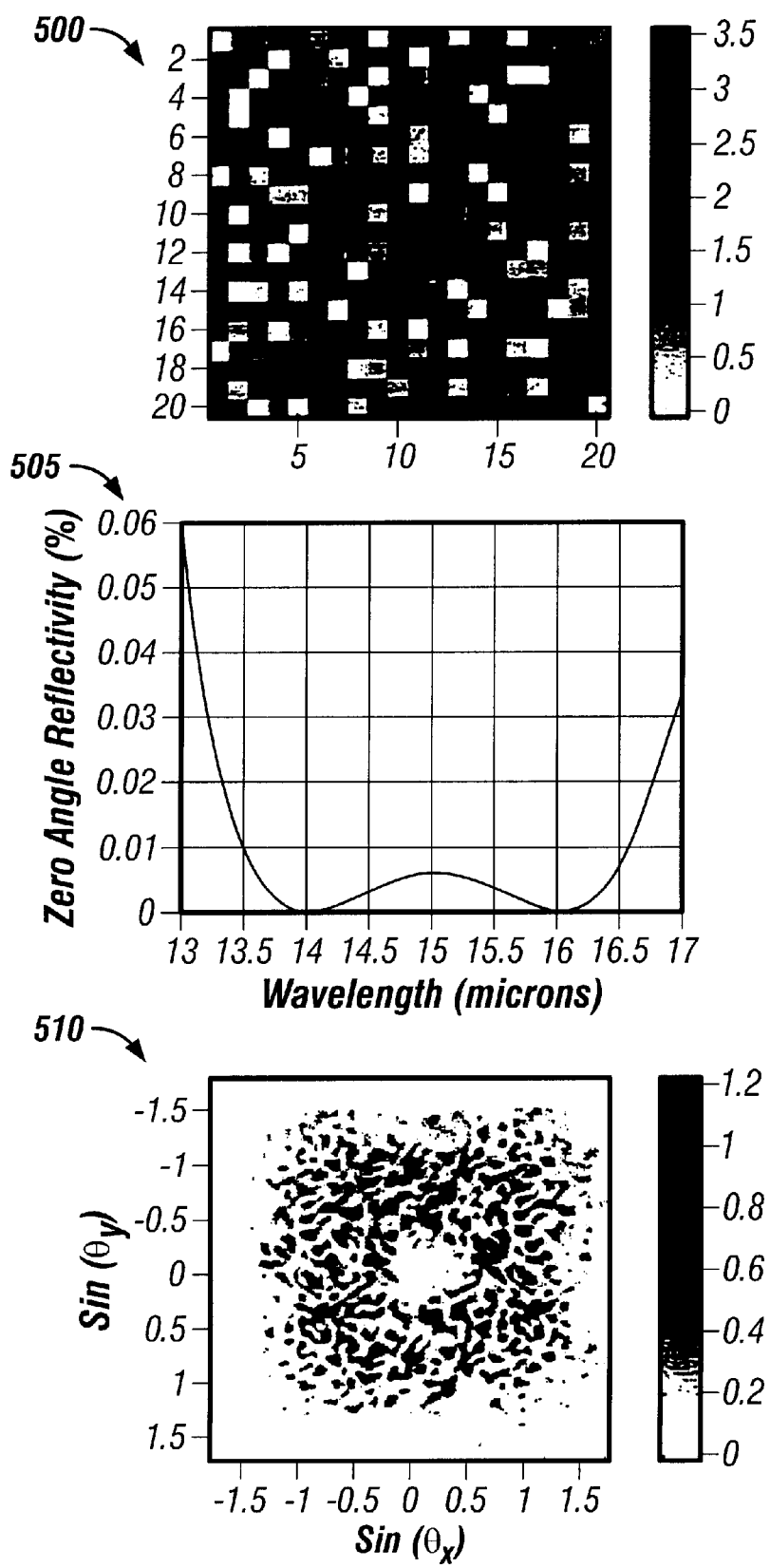
FIG. 5 illustrates an achromatic random reflector depth, reflectivity as a function of wavelength, and angular spectrum of reflected waves according to one embodiment of the invention.

FIG. 5 shows a gray-scale representation of a surface composed of such cells 500, the reflectivity as a function of wavelength 505, and the angular spectrum of reflected waves 510. The angular spectrum 510 is a gray-scale representation of the diffraction efficiency as a function of angle in two dimensions (the angle of incidence is zero). All waves inside the circle of radius sin (θ)=1 are propagating, and those outside the circle are evanescent. The reflectivity goes to zero at the two design wavelengths and the diffraction efficiency at high angles is strong-this is critical for QWIP absorption. Since this structure has zero reflectivity at more than one wavelength, it can be called "achromatic". The broadband nature of this structure also increases the etch depth tolerance during fabrication.

The structure in FIG. 5 can only be fabricated by analog-depth lithography (E-beam) due to the random depth of pixel 1. If the depth randomness is removed, i.e.

Figure 6:
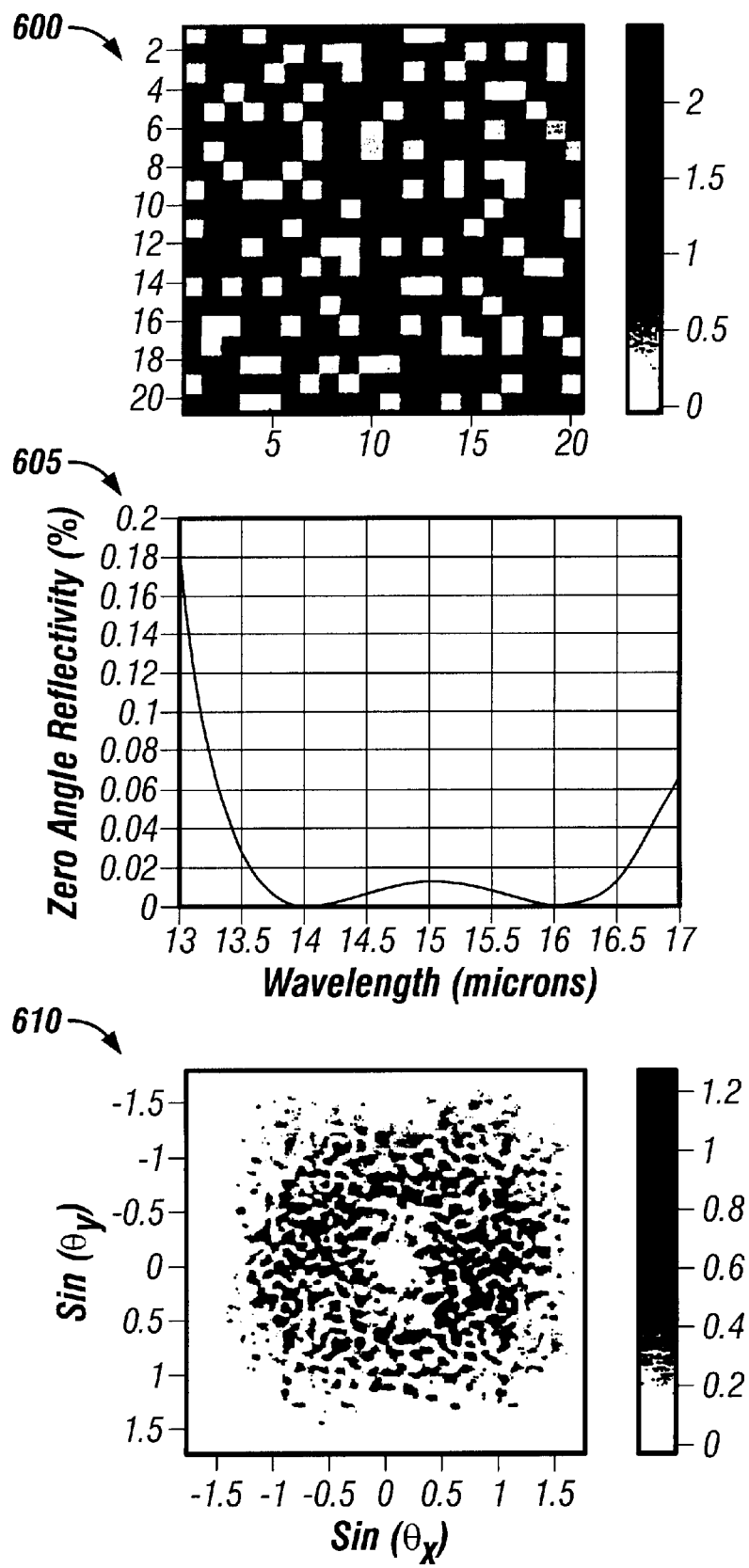
FIG. 6 illustrates a minimum achromatic random reflector depth, reflectivity as a function of wavelength, and angular spectrum of reflected waves according to one embodiment of the invention.

$d_1 = 0,$ $d_2 = \lambda_1/4,$ $d_3 = \lambda_2/4,$ $d_4 = \lambda_1/4 + \lambda_2/4.$ then the resulting structure still has null reflectivity at two wavelengths, but it is shallower and could be fabricated using a two-step photolithography and reactive-ion etch process. This structure is shown in FIG. 6. The first etch would be $\lambda_1/4$ and the second etch would be $\lambda_2/4$. FIG. 6 shows a gray-scale representation of a surface composed of such cells 600, the reflectivity as a function of wavelength 605, and the angular spectrum of reflected waves 610. These characteristics of this reflector are nearly as good as the analog-depth version.

Figure 7:
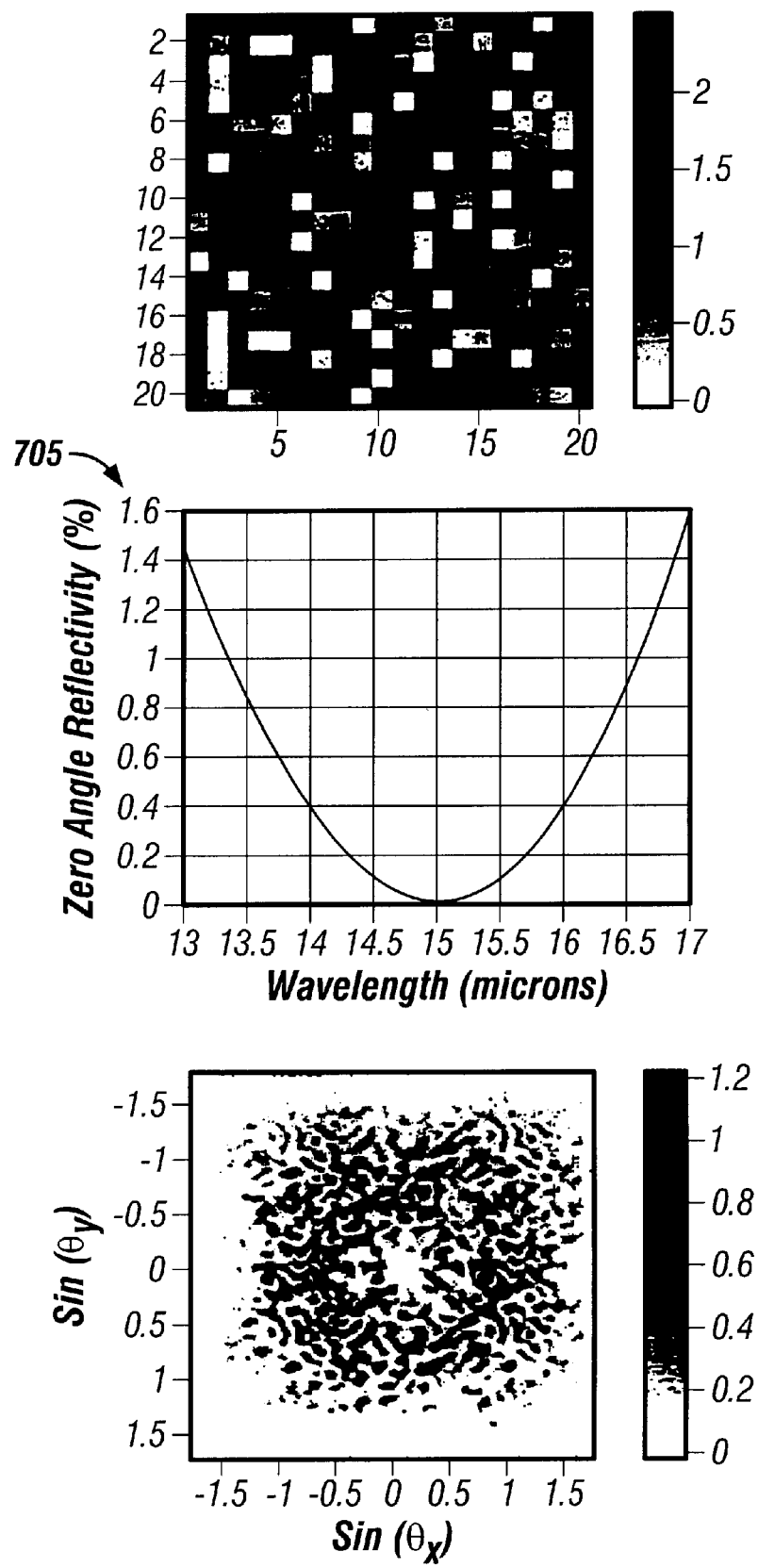
FIG. 7 illustrates a monochromatic achromatic random reflector depth, reflectivity as a function of wavelength, and angular spectrum of reflected waves according to one embodiment of the invention.

A single-wavelength design is $d_1 = rand(0 \ldots \lambda_1/4),$ $d_2 = d_1 + \lambda_1/4,$ $d_3 = rand(0 \ldots \lambda_1/4),$ $d_4 = d_3 + \lambda_1/4$ FIG. 7 shows that the resulting structure looks as random as the achromatic structure of FIG. 5, but the reflectivity 705 is zero at only a single wavelength. This puts a tight tolerance on the etch depth during fabrication.

Figure 8:
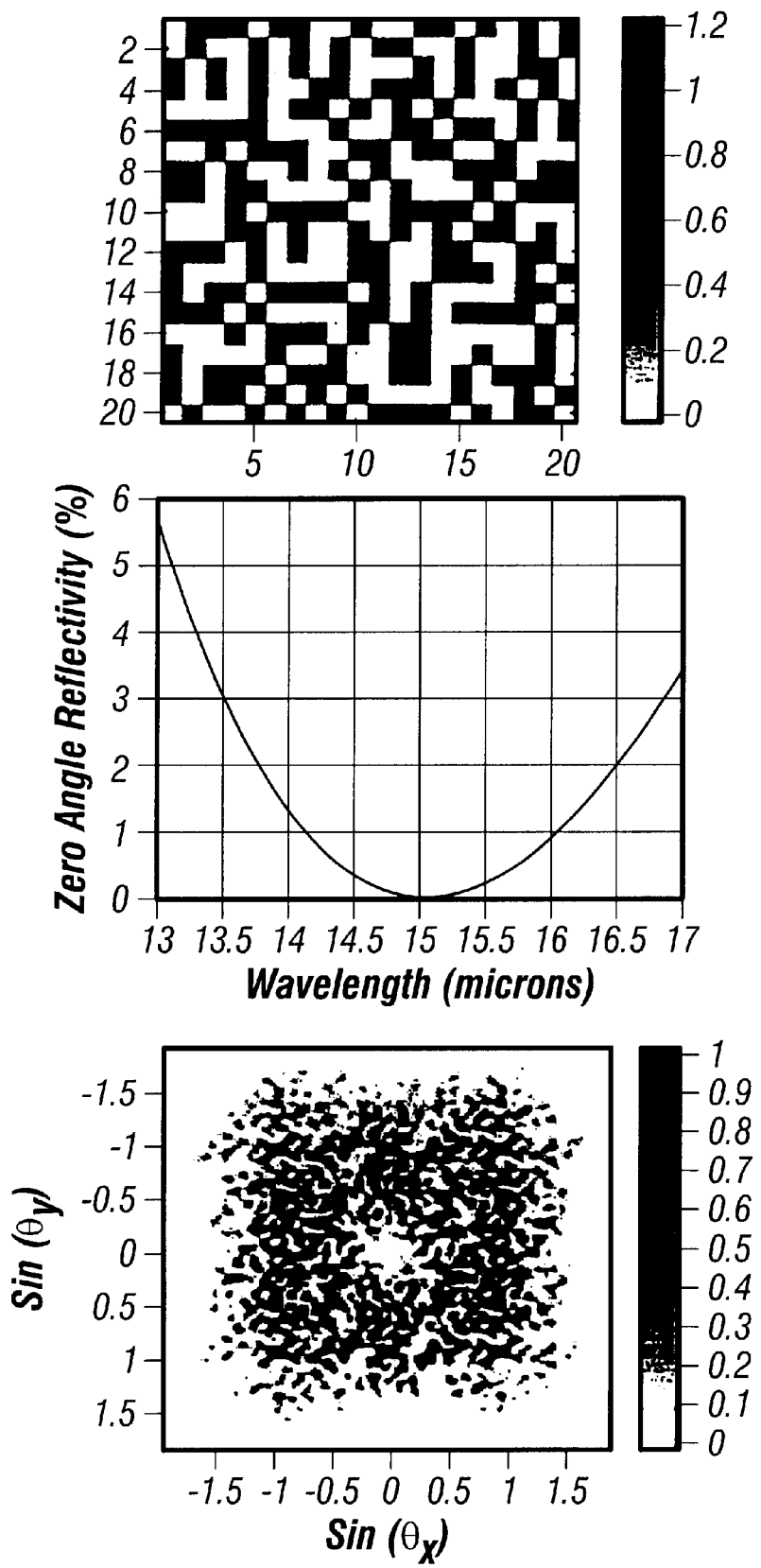
FIG. 8 illustrates a minimum depth monochromatic random reflector depth, reflectivity as a function of wavelength, and angular spectrum of reflected waves according to one embodiment of the invention.

A minimum-depth single-wavelength design is $d_1 = 0,$ $d_2 = \lambda_1/4,$ $d_3 = 0,$ $d_4 = \lambda_1/4$ FIG. 8 shows that the resulting structure is only random in the position of the pixels, and the reflectivity is much worse than the structures from FIGS. 5-8.

Figure 9:
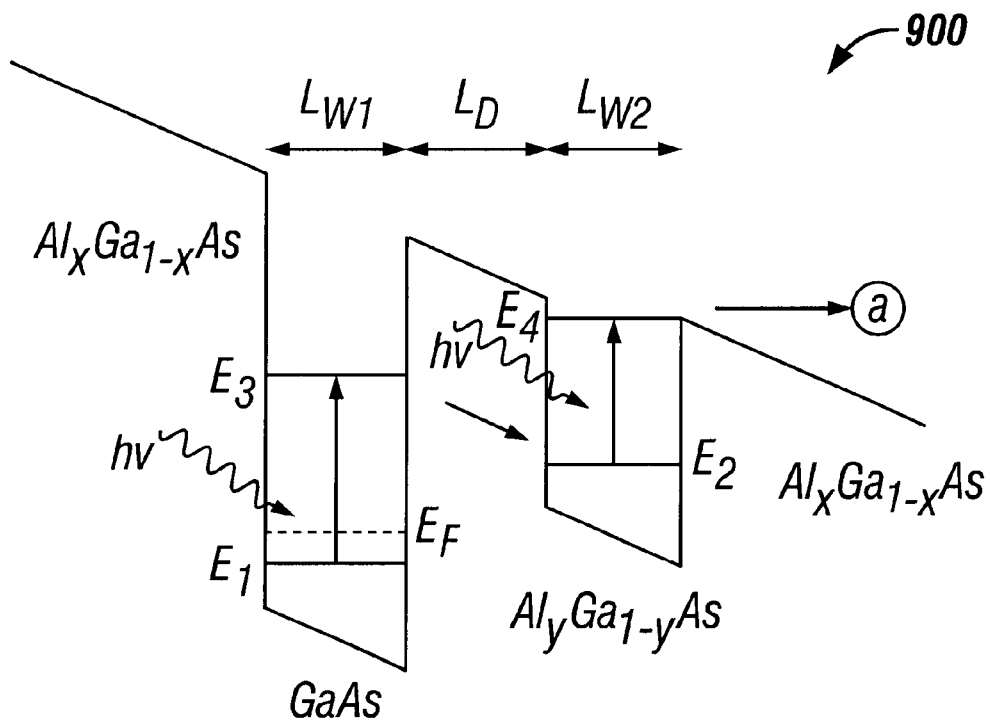
FIG. 9 is a schematic conduction band diagram of a portion of the photon assisted quantum well IR detector under bias.

The schematic band diagram 900 of the present invention is shown in FIG. 9. The structure, grown on a semi-insulating GaAs substrate by molecular beam epitaxy, consists of twenty-five stages. Each stage includes a coupled-well active region separated by thick barriers. The coupled-well active region is engineered so that, at the threshold electric field $E_1$ and $E_2$, levels are anticrossed such that $E_2 - E_1 = \Delta E_{hk}$ where $\Delta E_{hk}$ is the optical phonon energy. Barrier heights and well thickness are chosen such that both quantum wells have the same photoexcitation energy between ground and excited states such that:

$E_3 - E_1 = E_4 - E_2 = \Delta E_{hv} = hc/\lambda_p$ where $\Delta E_{hv}$ is photoexcitation energy associated with the peak wavelength $\lambda_p$. The ground state of the left quantum well is doped up to Fermi level $E_F$ which is located below $E_2$.

$E_F < E_2 - E_1$

During the transition, electrons in the $E_1$ ground state excite to the $E_3$ level by absorbing photons. As a result of Eq. 1, we can obtain a very short life time between $E_3$ and $E_2$ states since their energy separation is resonant with the optical phonon without any momentum transfer. For a $L_D = 60$ Å barrier separation, this life time is about $\tau_{32} \approx 0.6$ picoseconds. Therefore, photoexcited electrons in the level $E_3$ will relax to $E_2$ and populate the ground state ($E_2$) of the right quantum well. The life time of the level $E_2$ is longer since it involves optical phonon emission (from $E_2$ to $E_1$) associated with a large momentum transfer. Now, these electrons can escape from the quantum well by absorbing a second photon and be collected as photocurrent.

The design and optimization of the proposed scattering enhanced double quantum well infrared detector is based on the balancing of the various transition processes inside the device as well as the coupling of the device to the environment. The device performance depends strongly on efficient coupling of the desired excitation path from the ground state via two photon absorption processes and one polar optical phonon emission process. Design of the two quantum well and central barrier widths will determine the efficiency of the polar optical phonon emission process. Processes that decrease the performance of the device can be classified into two groups 1) thermionic emission out of the quantum wells and 2) non-radiative recombination from the exited states out of the desired path back into the ground state. Acoustic phonon, polar optical phonon, and interface roughness scattering are expected to be major non-radiative processes.

The theoretical work proposed here will compute the various scattering and tunneling rates based on a quantum mechanical treatment of scattering Hamiltonians in a full bandstructure basis. Combined with a model for carrier capture and thermionic emission from the individual states in the double quantum well, a rate equation-based description of the electron transport through the structure will be developed. The composite output of the calculation will be the dark current, absorption linewidths, and signal-to-noise ratios. The device design will be aided by a graphical user interface that enables the entry and variation of structural data, material parameter data, applied bias, and incident photon flux. The device designer will be able to vary structural data, such as the width of a quantum well, and obtain fast feedback to achieve optimal designs.

Although this device concept reduces the quantum efficiency by a factor of 2 (two photons are required to get one electron out) or more compared to a typical QWIP, the reduction in dark current is expected to be much more than factor of 2. Depopulation of energy levels by using resonant phonon scattering is a proven concept. At typical operating temperatures (e.g. T>55 K for $\lambda$=15 $\mu$m detector), QWIP dark current is dominated by classical thermionic emission and thermal assisted tunneling which depends exponentially on barrier height from the ground state, i.e.

$$I_{QWIP} \alpha e^{-(\Delta E_b - E_F)/k_B T}$$

where T is the operating temperature, and $k_B$ is Boltzman's constant.

Figure 10:
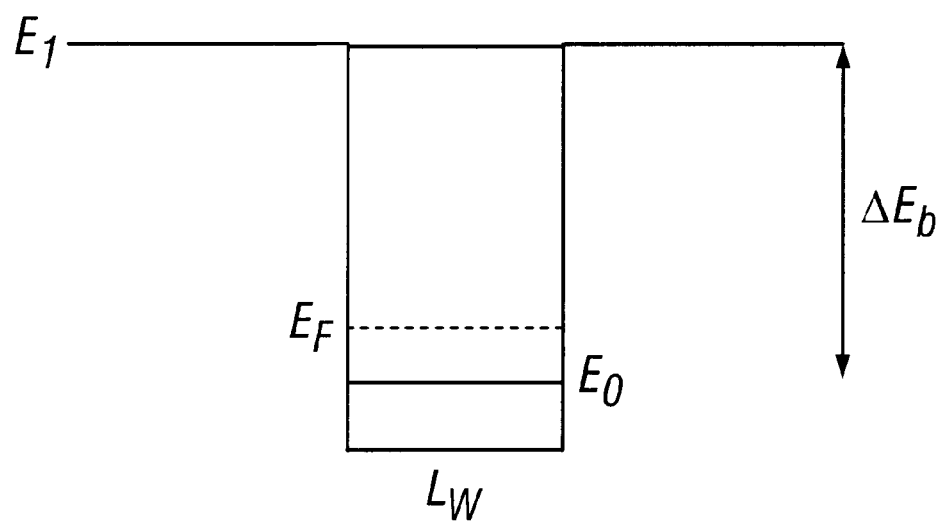
FIG. 10 is a schematic band diagram of a single quantum well according to an embodiment of the present invention.

FIG. 10 shows $\Delta AE_b$ and $E_F$ are quantum well barrier height and ground state Fermi energy, measured from the ground state. Even though, one can increase $\Delta E_b$ to reduce the dark current, $\Delta E_b$ is limited by the energy level difference between the ground and excited state, i.e. $\Delta E_b \approx E_1 - E_0$. This requirement is very critical at longer wavelengths because photoexcitation energy decreases as wavelength increases ($E_1 - E_0 \approx 82$ meV at $\lambda \approx 15$ $\mu$m). In order to optimize performance, QWIP structures are typically designed by placing the first excited state exactly at the well top, which is referred as a bound-to-quasibound quantum well. Dropping the first excited state to the well top allows maximization of the thermionic barrier without stopping photoexcited electrons escaping from the excited state to the continuum. Therefore, dark current for a bound-to-quasibound QWIP can be expressed as:

$$I_{QWIP} \alpha e^{-(\Delta E_{hv} - E_F)/k_B T}$$

However for the proposed structure effective thermal barrier height is:

$$\Delta E_b = E_4 - E_1 - E_F \approx 2 \cdot \Delta E_{hv} - \Delta E_{hk}$$

Therefore, the dark current reduction factor can be estimated as:

$$\frac{I_{DWELL}}{I_{QWIP}} = e^{-(\Delta E_{hv} - \Delta E_{hk})/k_B T}$$

Where $\Delta E_{hk}$ is optical phonon energy. For $\lambda$p=15 mm detector, $\Delta E_{hv} \approx 82$ meV, $\Delta E_{hk} \approx 36$ meV and T=55 K:

$$\frac{I_{DWELL}}{I_{QWIP}} \approx \frac{1}{1000}$$

which is about a factor of 1000 in reduction of the dark current.

Numerous variations and modifications of the invention will become readily apparent to those skilled in the art. Accordingly, the invention may be embodied in other specific forms without departing from its spirit or essential characteristics.

What is claimed is:

1. A multi-color quantum well infrared photodetector (QWIP) comprising:

a plurality of contact layers;

a plurality of quantum well infrared photodetector (QWIP) layers positioned proximate the contact layers, wherein each of the plurality of quantum well infrared photodetector (QWIP) layers are sensitive to separate frequencies;

an isolation layer which separates two of the plurality of quantum well infrared photodetector (QWIP); and a plurality of contacts which allow independent access to each of the plurality of quantum well infrared photodetector (QWIP) layers.

2. The multi-color quantum well infrared photodetector (QWIP) of claim 1, further comprising an achromatic random reflector positioned above the plurality of quantum well infrared photodetector (QWIP) layers.

3. The multi-color quantum well infrared photodetector (QWIP) of claim 2, wherein the achromatic random reflector has a zero normal reflectivity at more than one wavelength.

4. The multi-color quantum well infrared photodetector (QWIP) of claim 1, further comprising short-circuiting a first of the plurality of contact layers with a second of the plurality of contact layers to create a detector common.

5. The multi-color quantum well infrared photodetector (QWIP) of claim 1, wherein the contacts are indium bumps.

6. The multi-color quantum well infrared photodetector (QWIP) of claim 1, wherein there are three quantum well infrared photodetector (QWIP) layers per pixel.

7. The multi-color quantum well infrared photodetector (QWIP) of claim 1, further comprising metal interconnects which connect the plurality of quantum well infrared photodetector (QWIP) layers.

* * * * *